US008847192B2

(12) United States Patent
Lee et al.

(10) Patent No.: US 8,847,192 B2
(45) Date of Patent: Sep. 30, 2014

(54) RESISTIVE SWITCHING DEVICES HAVING ALLOYED ELECTRODES AND METHODS OF FORMATION THEREOF

(75) Inventors: Wei Ti Lee, San Jose, CA (US); Chakravarthy Gopalan, Santa Clara, CA (US); Yi Ma, Santa Clara, CA (US); Jeffrey Shields, Sunnyvale, CA (US); Philippe Blanchard, Moigny sur Ecole (FR); John Ross Jameson, Burlingame, CA (US); Foroozan Sarah Koushan, San Jose, CA (US); Janet Wang, Los Altos, CA (US); Mark Kellam, Siler City, NC (US)

(73) Assignees: Adesto Technologies France SARL, Paris (FR); Adesto Technologies Corporation, Sunnyvale, CA (US)

( * ) Notice: Subject to any disclaimer, the term of this patent is extended or adjusted under 35 U.S.C. 154(b) by 0 days.

(21) Appl. No.: 13/558,296

(22) Filed: Jul. 25, 2012

(65) Prior Publication Data

US 2013/0062587 A1    Mar. 14, 2013

Related U.S. Application Data

(63) Continuation of application No. PCT/US2012/046745, filed on Jul. 13, 2012.

(60) Provisional application No. 61/534,011, filed on Sep. 13, 2011.

(51) Int. Cl.
*H01L 47/00* (2006.01)
*H01L 45/00* (2006.01)

(52) U.S. Cl.
CPC ............ *H01L 45/08* (2013.01); *H01L 45/1266* (2013.01); *H01L 45/142* (2013.01); *H01L 45/146* (2013.01); *H01L 45/1658* (2013.01); *H01L 45/085* (2013.01); *H01L 45/16* (2013.01); *H01L 45/144* (2013.01); *H01L 45/147* (2013.01); *H01L 45/1233* (2013.01)
USPC ... 257/4; 257/3; 257/5; 257/42; 257/E21.004; 438/84; 438/85; 438/382

(58) Field of Classification Search
CPC ....... H01L 45/04; H01L 27/24; H01L 45/145; H01L 29/00; H01L 21/10; H01L 21/06; H01L 21/105; H01L 21/108; G11C 13/0004
USPC ............ 257/4, E47.001, E21.004, 2, 42, 3, 5; 438/84, 95, 102, 382; 365/129, 148, 365/151, 153
See application file for complete search history.

(56) References Cited

U.S. PATENT DOCUMENTS

| 6,635,914 B2 | 10/2003 | Kozicki et al. |
| 7,359,236 B2 | 4/2008 | Gilbert |

(Continued)

OTHER PUBLICATIONS

Jameson, et al., "One-Dimensional Model of the Programming Kinetics of Conductive-Bridge Memory Cells," Applied Physics Letters 99, 2011 American Institute of Physics, Aug. 9, 2011, 3 pages.

(Continued)

*Primary Examiner* — Thinh T Nguyen
(74) *Attorney, Agent, or Firm* — Slater & Matsil, L.L.P.

(57) ABSTRACT

In accordance with an embodiment of the present invention, a resistive switching device comprises a bottom electrode, a switching layer disposed over the bottom electrode, and a top electrode disposed over the switching layer. The top electrode comprises an alloy of a memory metal and an alloying element. The top electrode provides a source of the memory metal. The memory metal is configured to change a state of the switching layer.

32 Claims, 19 Drawing Sheets

(56) References Cited

U.S. PATENT DOCUMENTS

| | | |
|---|---|---|
| 7,368,314 B2 | 5/2008 | Ufert |
| 7,511,294 B2 * | 3/2009 | Ufert .................................. 257/5 |
| 2006/0011910 A1 * | 1/2006 | Campbell ........................ 257/42 |
| 2006/0060832 A1 | 3/2006 | Symanczyk et al. |
| 2006/0181920 A1 * | 8/2006 | Ufert ............................. 365/153 |
| 2006/0199377 A1 | 9/2006 | Ufert |
| 2008/0253168 A1 | 10/2008 | Blanchard et al. |
| 2009/0140232 A1 | 6/2009 | Ufert |
| 2009/0166601 A1 * | 7/2009 | Czubatyj et al. ................... 257/3 |
| 2010/0059729 A1 * | 3/2010 | Hudgens ........................... 257/2 |
| 2011/0317470 A1 | 12/2011 | Lu et al. |

OTHER PUBLICATIONS

International Search Report and Written Opinion of the International Searching Authoirty for Application No. PCT/US12/46745, mailed Dec. 7, 2012, 12 pages.

* cited by examiner

RESISTIVE SWITCHING DEVICES HAVING ALLOYED ELECTRODES AND METHODS OF FORMATION THEREOF

This application is a continuation of International Application No. PCT/US12/46745, filed on Jul. 13, 2012, entitled "Resistive Switching Devices Having Alloyed Electrodes and Methods of Formation Thereof," and also claims the benefit of U.S. Provisional Application No. 61/534,011, filed on Sep. 13, 2011, entitled "Ag-Alloy Top Electrode for Improved CBRAM Performance," both of which applications are incorporated herein by reference.

TECHNICAL FIELD

The present invention relates generally to resistive switching devices, and more particularly to resistive switching devices having alloyed electrodes and methods of formation thereof.

BACKGROUND

Semiconductor industry relies on device scaling to deliver improved performance at lower costs. Flash memory is the mainstream non-volatile memory in today's market. However, Flash memory has a number of limitations that is posing a significant threat to continued advancement of memory technology. Therefore, the industry is exploring alternative memories to replace Flash memory. Contenders for future memory technology include magnetic storage random access memory (MRAM), ferroelectric RAM (FeRAM), and resistive switching memories such as phase change RAM (PCRAM), metal oxide based memories, and ionic memories such as conductive bridging random access memory (CBRAM) or programmable metallization cell (PMC) memory. These memories are also called as emerging memories.

To be viable, the emerging memory has to be better than Flash memory in more than one technology metrics such as scalability, performance, energy efficiency, On/Off ratio, operational temperature, CMOS compatibility, and reliability. Further, the emerging memory has to have a cost advantage or at least not be prohibitively expensive. However, production costs depend on many factors such as process yield, which may be significantly increase manufacturing costs.

SUMMARY OF THE INVENTION

In accordance with an embodiment of the present invention, a resistive switching device comprises a bottom electrode, a switching layer disposed over the bottom electrode, and a top electrode disposed over the switching layer. The top electrode comprises an alloy of a memory metal and an alloying element. The top electrode provides a source of the memory metal. The memory metal is configured to change a state of the switching layer.

In accordance with an embodiment of the present invention, a resistive switching device comprises an inert electrode, an electrochemically active electrode spaced apart from the inert electrode. The electrochemically active electrode provides a source of a memory metal. The electrochemically active electrode comprises an alloy of the memory metal and an alloying element. A switching layer is disposed between the inert electrode and the electrochemically active electrode. The memory metal is configured to change a state of the switching layer.

In accordance with an embodiment of the present invention, a method of forming a resistive switching device comprises forming a bottom electrode over a substrate, forming a switching layer over the bottom electrode, and forming a top electrode over the switching layer. The top electrode provides a source of a memory metal. The top electrode comprises an alloy of the memory metal and an alloying element. The memory metal is configured to change a state of the switching layer.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes FIGS. 2A-2D, illustrates a resistive switching device in accordance with an alternative embodiment of the invention, wherein FIG. 2A illustrates a cross-sectional view and wherein FIGS. 2B-2D, illustrate 1-D profiles of the alloying element in the top electrode layer;

FIG. 3, which includes

FIG. 5, which includes

FIG. 6, which includes FIG. 7, which includes

Corresponding numerals and symbols in the different figures generally refer to corresponding parts unless otherwise indicated. The Figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of contexts. The embodiments discussed are merely illustrative of a few ways to make and use the invention, and do not limit the scope of the invention.

Embodiments of the invention enable faster and reliable operation of resistive switching memories by using alloyed electrodes. Further, advantageously, embodiments of the invention overcome yield issues that may be associated with the formation of top electrodes.

A structural embodiment of the present invention for a resistive switching device will be described using FIG. 1. Further structural embodiments of the resistive switching device will be described using FIGS. 2-4. Embodiments of methods of fabricating the resistive switching device will be described using FIGS. 5-7.

Figure 1:
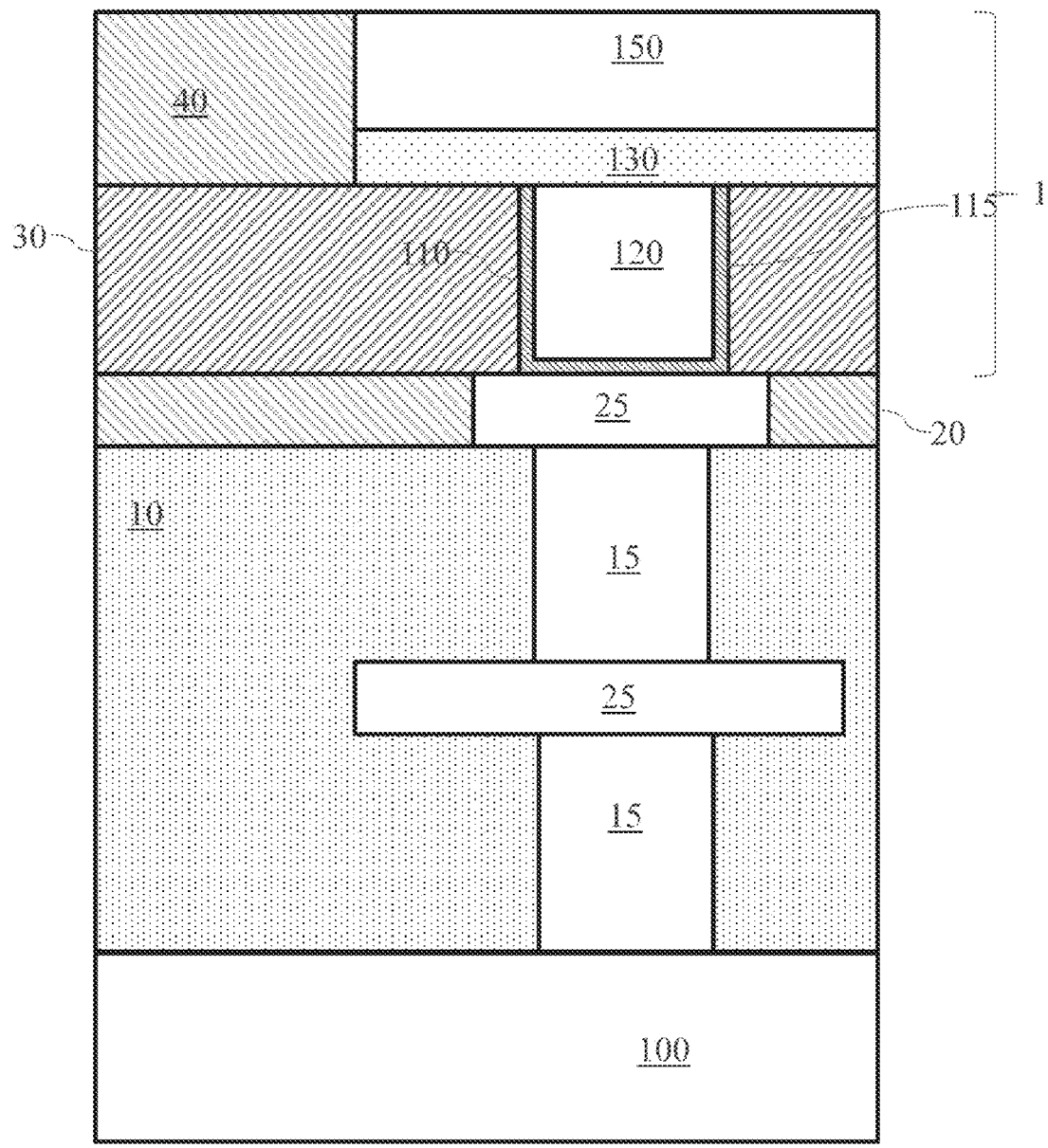
FIG. 1 illustrates a resistive switching device integrated over a semiconductor substrate in accordance with an embodiment of the invention.

FIG. 1 illustrates a resistive switching device integrated over a semiconductor substrate in accordance with an embodiment of the invention.

Referring to FIG. 1, a resistive switching device 1 is disposed over a substrate 100. The resistive switching device 1 is disposed within the metallization levels formed over the substrate 100. In various integration schemes, the location of the resistive switching device 1 within the metallization layers may be different. As an example, in one embodiment, the resistive switching device 1 may be formed over the first and the second metal levels.

As illustrated in FIG. 1, in one or more embodiments, at least one of a plurality of metal lines 25 and at least one of a plurality of vias 15 are disposed within a first insulating layer 10 over a substrate 100.

The substrate 100 may comprise a bulk silicon substrate or a silicon-on-insulator substrate. In various embodiments, the substrate 100 may comprise SiGe, GaN, or other semiconductor materials. In one or more embodiments, the substrate 100 may comprise any other suitable semiconductor, for example, within which an access device such as a transistor or a diode may be fabricated.

In various embodiments, the resistive switching device 1 comprises a bottom electrode 115, a switching layer 130, and a top electrode layer 150. The bottom electrode 115 may be coupled to a metal line of the plurality of metal lines 25 disposed within a second insulating layer 20 in one embodiment. In various embodiments, the second insulating layer 20 may be the same material as the first insulating layer 10 or may be a different dielectric material.

In various embodiments, the bottom electrode 115 may be an inert electrode and may be enclosed within a diffusion barrier/adhesion promoting layer. Accordingly, the bottom electrode 115 may comprise a barrier layer 110 and a fill material 120 disposed within the barrier layer 110. Together, the barrier layer 110 and the fill material 120 form the bottom electrode 115. In one embodiment, tungsten (W) may be used as the fill material 120. Thus, tungsten plugs may be used as the bottom electrode 115. In other embodiments, the bottom electrode 115 may comprise platinum, ruthenium, tantalum, titanium nitride, tantalum nitride, titanium tungsten (TiW), molybdenum, gold, nickel, cobalt, iridium, and combinations thereof, and such others. Accordingly, in various embodiments, the fill material 120 may comprise platinum, ruthenium, tantalum, tungsten, titanium tungsten (TiW), molybdenum, gold, nickel, cobalt, iridium, and combinations thereof, and such others.

The barrier layer 110 is designed to prevent in-diffusion of metal atoms from the underlying metal line of the plurality of metal lines 25. Further, the barrier layer 110 may be configured to promote adhesion with the third insulating layer 30 as well as to prevent diffusion of metal atoms from the fill material 120 into the third insulating layer 30. In one embodiment, the barrier layer 110 may comprise tantalum nitride to prevent copper diffusion from the underlying metal line of the plurality of metal lines 25. In an alternative embodiment, the barrier layer 110 may comprise titanium nitride. In other embodiments, the barrier layer 110 may comprise ruthenium, tungsten nitride, and other suitable materials used as barrier in the semiconductor industry.

The bottom electrode 115 may be embedded within a third insulating layer 30 in one embodiment.

In one or more embodiments, the switching layer 130 may comprise a solid electrolyte layer that provides an ion conducting path capable of forming a conductive bridge. In various embodiments, the solid electrolyte (switching layer 130) may comprise a chalcogenide material such as a germanium based chalcogenide, e.g., a copper doped $GeS_2$ layer. In an alternative embodiment, the solid electrolyte may comprise silver doped $GeS_2$. In other embodiments, the solid electrolyte may comprise copper doped $WO_3$, $Cu/Cu_2S$, $Cu/Ta_2O_5$, $Cu/SiO_2$, $Ag/Zn_xCd_{1-x}S$, $Cu/Zn_xCd_{1-x}S$, $Zn/Zn_xCd_{1-x}S$, GeTe, GST, As—S, $Zn_xCd_{1-x}S$, $TiO_2$, $ZrO_2$, $SiO_2$. In some embodiments, the solid electrolyte may comprise a plurality of layers and may include bilayers such as $Ge_xSe_y/SiO_x$, $Ge_xSe_y/Ta_2O_5$, $Cu_xS/Cu_xO$, $Cu_xS/SiO_2$ and combinations thereof.

In one embodiment, the switching layer 130 may comprise transition metal oxides that change conductivity due to the formation of charged point defects such as oxygen vacancies and other charge complexes so as to form a metallic conducting phase. The switching layer 130 may comprise metal oxides such as copper and/or silver doped hafnium oxide, gadolinium oxide, and other such materials in various embodiments. In other examples, a metal oxide based switching layer 130 may comprise $NiO_x$, $TiO_x$, $Al_2O_3$, $Ta_2O_5$, $CuO_x$, $WO_x$, CoO, chromium doped perovskite oxides such as $SrZrO_3$, (Ba, Sr)$TiO_3$, $SrTiO_3$, copper doped $MoO_x$, copper doped $Al_2O_3$, copper doped $ZrO_2$, Al doped ZnO, $Pr_{0.7}Ca_{0.3}MnO_3$.

The resistive switching device further comprises a top electrode layer 150 disposed over and contacting the switching layer 130. As an illustration, atomic metal or memory metal in the top electrode layer 150 is converted to metal ions, which may diffuse into the switching layer 130 rendering it conductive.

The top electrode layer 150 may comprise an electrochemically active metal such as silver, copper, zinc, and others in various embodiments. The top electrode layer 150 may also have a cap layer such as titanium nitride or tantalum nitride (as well as other suitable materials) in various embodiments.

In various embodiments, the top electrode layer 150 may comprise a crystalline material and/or an amorphous material. For example, in one or more embodiments, the top electrode layer 150 may comprise an amorphous layer comprising $TaW_xSi_yB_z$ or $TaW_xSi_yC_z$, which may be doped with an electrochemically active metal (memory metal).

In various embodiments, the switching layer 130 and the top electrode layer 150 may be formed within a fourth insulating layer 40, which may be a suitable inter level dielectric. Examples of the fourth insulating layer 40 may include silicon dioxide, silicon nitride, silicon oxynitride, and other low-k dielectrics. The fourth insulating layer 40 may be a plurality of layers such as a bilayer in some embodiments.

In one or more embodiments, the top electrode layer 150 comprises an alloy that allows more efficient oxidation of the metal in the top electrode layer 150, which is the source of the metal ions. Further, the top electrode layer 150 facilitates injection of the generated metal ions when an electric field is applied and further facilitates dissolution of the metal ions from the switching layer 130 when the electric field is reversed.

In one or more embodiments, the top electrode layer 150 is a memory metal alloy, which is an alloy of the memory metal and an alloying element. The memory metal is the diffusing metal that results in the formation of the conduction path within the switching layer 130. In one or more embodiments, the alloying element comprises copper when the memory metal comprises silver. In various embodiments, the top electrode layer 150 having a silver memory metal may further comprise ruthenium, titanium, indium, aluminum, nickel, magnesium, germanium, and combinations thereof. In various embodiments, the top electrode layer 150 may comprise AgCu, AgRu, AgTi, AgAl, AgIn, AgNi, AgMg, AgGe, and combinations thereof. In alternative embodiments, the top electrode layer 150 may comprise CuAg, CuRu, CuTi, CuAl, CuIn, CuNi, CuMg, AgGe, and combinations thereof.

In various embodiments, more than one alloying element may be used to form the memory metal alloy. In various embodiments, the total concentration of the alloying elements in the top electrode layer 150 may vary from about 0.1% to about 80% by atomic fraction (concentration). In one embodiment, the total concentration of the alloying elements in the top electrode layer 150 may vary from about 1% to about 50% by atomic fraction (concentration). In one embodiment, the total concentration of the alloying elements in the top electrode layer 150 may vary from about 5% to about 25% by atomic fraction (concentration). In one embodiment, the total concentration of the alloying elements in the top electrode layer 150 is at least about 25% in atomic fraction (concentration). In one embodiment, the total concentration of the alloying elements in the top electrode layer 150 is at least about 5% atomic fraction (concentration).

In various embodiments, the alloying element may also influence or change the switching behavior, for example, the alloying element may be ionized and transferred into the switching layer 130 similar to the memory metal. In such cases, the amount of the alloying element may also be related to the switching layer 130. Accordingly, in one or more embodiments, the dose of the alloying element in the top electrode layer 150 may be about 1% to about 50% of the total number of atoms in the switching layer 130. In one or more embodiments, the dose of the alloying element in the top electrode layer 150 may be about 10% to about 50% of the total number of atoms in the switching layer 130.

In one or more embodiments, addition of the alloying metal in the top electrode layer 150 may improve the agglomeration resistance of the memory metal, and may thus provide a smoother interface between the switching layer 130 and the top electrode layer 150. In various embodiments, addition of the metal alloy reduces the surface roughness of the top electrode layer 150 at an interface between the switching layer 130 and the top electrode layer 150. In one or more embodiments, the root mean square of the surface roughness of the interface is less than about 5 nm. In one or more embodiments, the root mean square of the surface roughness of the interface is less than about 3 nm. In one or more embodiments, the root mean square of the surface roughness of the interface is about 1 nm to about 5 nm. In one or more embodiments, the root mean square of the surface roughness of the interface is about 0.3 nm to about 3 nm.

The addition of alloying metal in the top electrode layer 150 may also result in a "mixed ion" effect slowing down the migration of the memory metal into the switching layer 130 during processing, which may prevent agglomeration and shorts due to over saturation, but may not negatively impact the device performance.

Addition of alloying metal in the top electrode layer 150 may also be used to tailor the work function of the top electrode layer 150 and ion injection efficiency thereby controlling the speed of the device. For example, time to program data may be used to monitor the changes in performance with the content of the alloying metal in the top electrode layer 150. Using such alloying, the work function between top and bottom electrodes can be changed to various degrees depending on the type and concentrations of the alloying metal in the top electrode layer 150.

The addition of alloying metal in the top electrode layer 150 may also improve the thermal stability of the resistive switching memory's stack due to improved agglomeration control. This in turn may improve the manufacturability of the resistive switching memory. For example, conventional back end of the line processes that include high temperature thermal conditions may be used after forming the top electrode layer 150 without degrading the resistive switching memory. The improvement may also be due to smoother interface between the top electrode layer 150 and the switching layer 130, which among others, may reduce variation, for example, due to less work function variation along the device.

In various embodiments, incorporation of the alloying metal in the top electrode layer 150 may also modulate the performance and reliability response of the resistive switching memory device. Embodiments of the invention may also be combined with other optimization in switching layer 130 quality, thickness, and morphology in various embodiments. Embodiments of the invention may advantageously improve retention loss reduction by as much as 50%. Furthermore, advantageously, endurance may also be modulated by alloying of the top electrode layer 150 and changes in the switching layer 130. Embodiments of the invention may be used to modulate the programming speed of the first cycle as well as subsequent cycles.

Figure 2A:
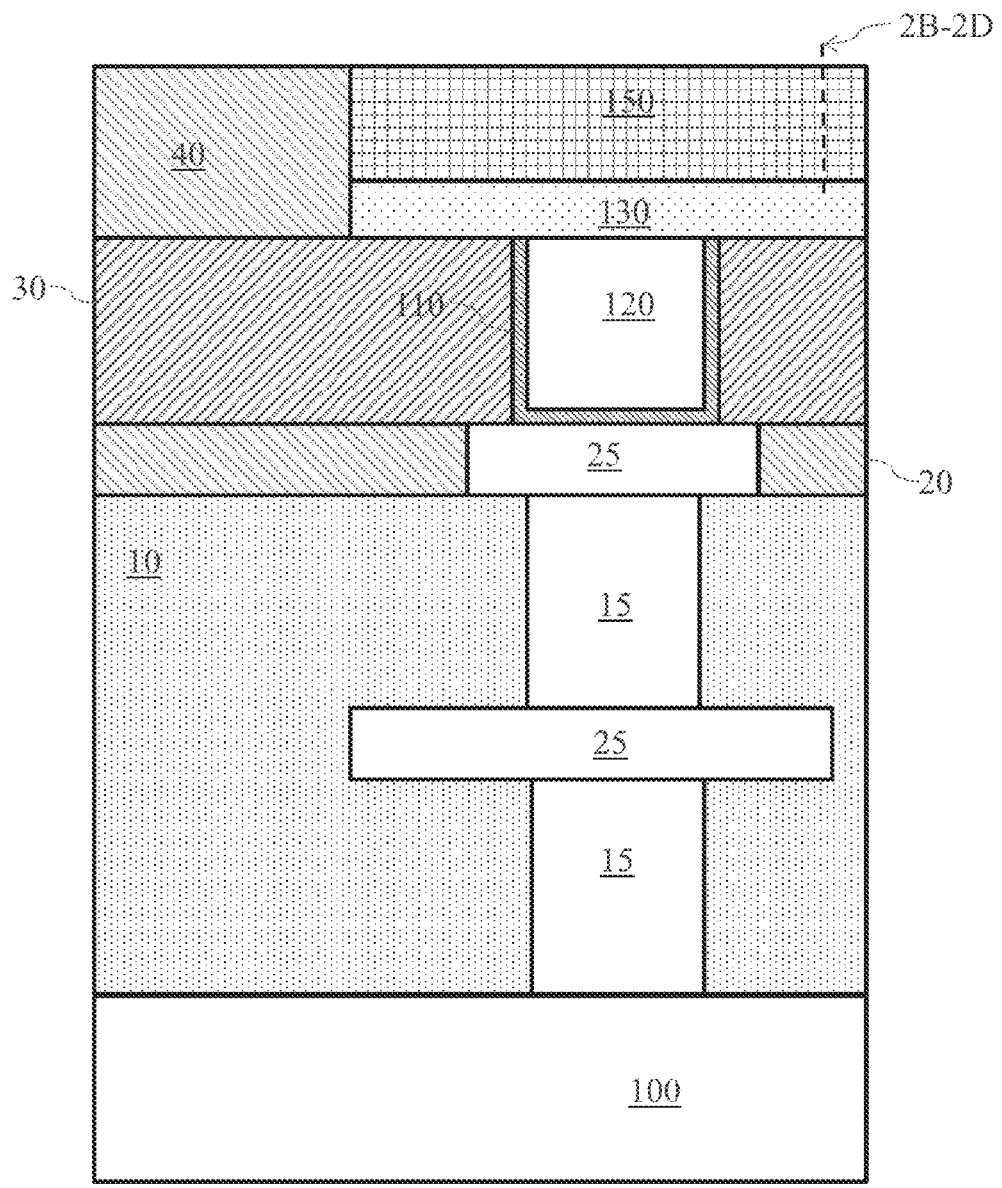
Figure 2B:
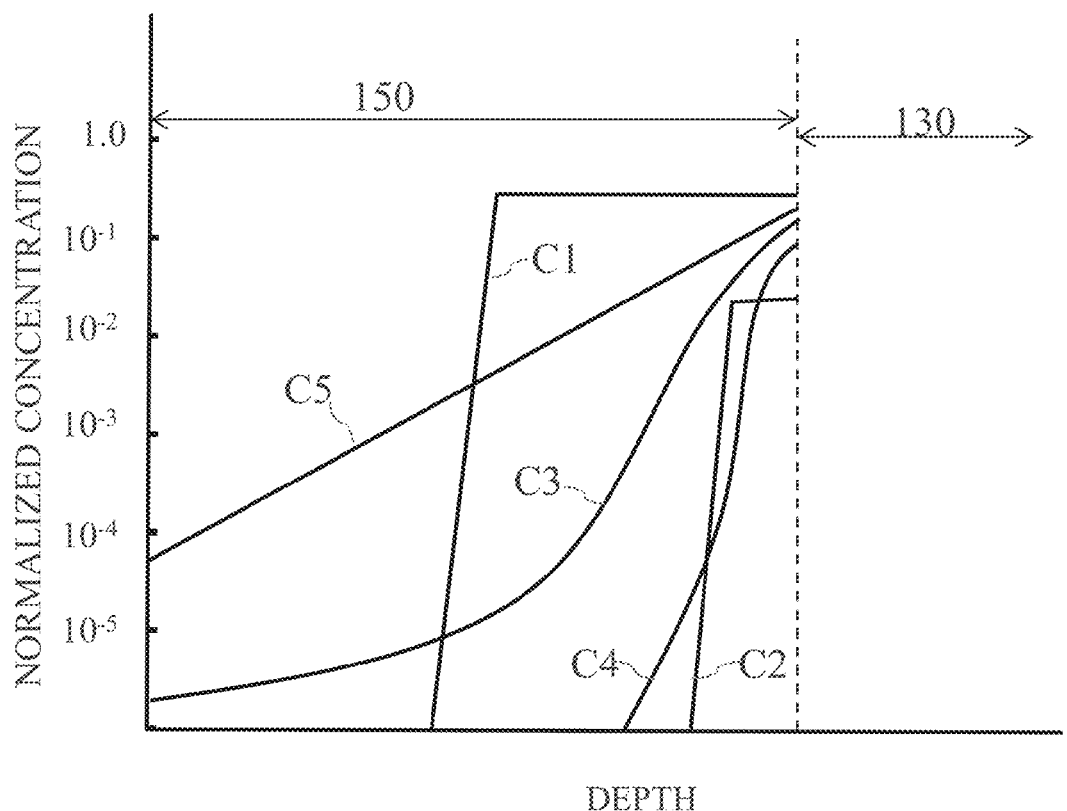
Figure 2C:
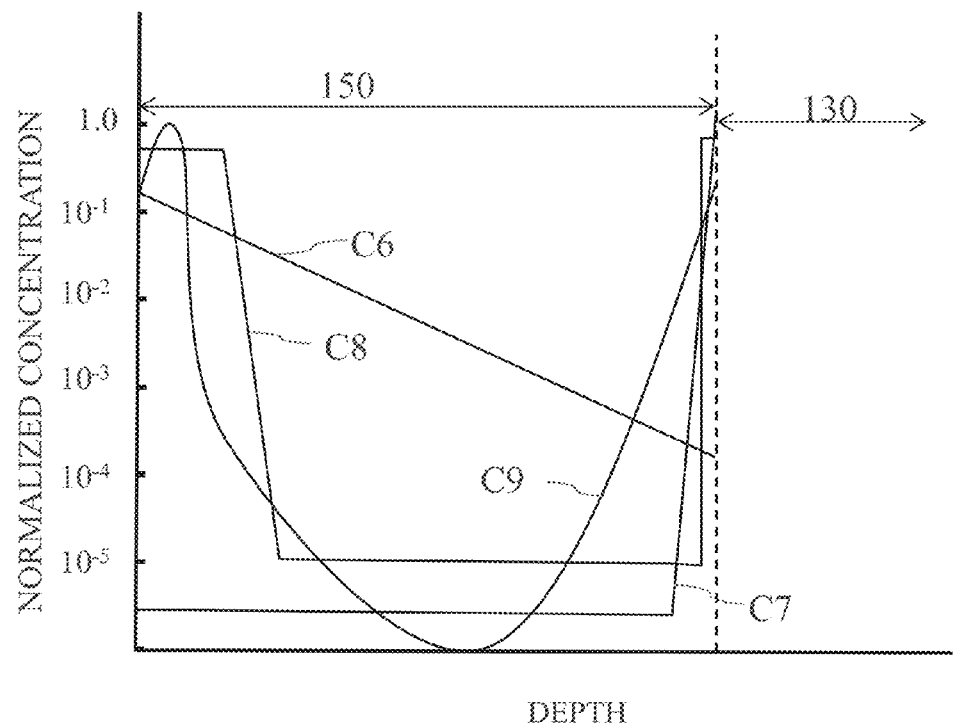
Figure 2D:
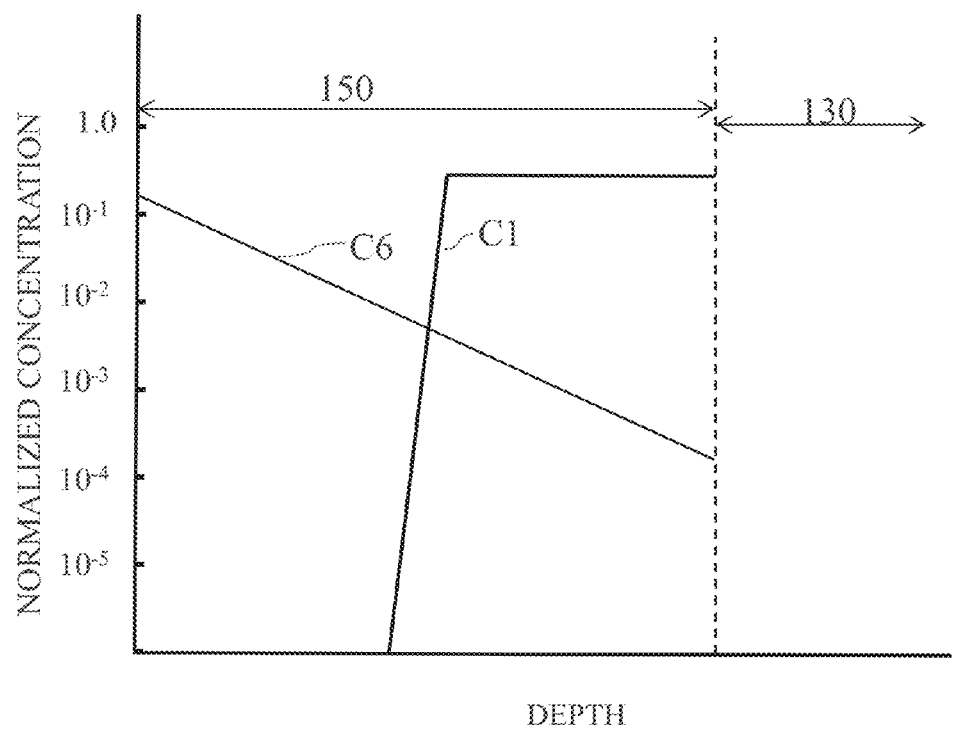

FIG. 2, which includes FIGS. 2A-2D, illustrates a resistive switching device in accordance with an alternative embodiment of the invention, wherein FIG. 2A illustrates a cross-sectional view and wherein FIGS. 2B-2D, illustrate 1-D profiles of the alloying element in the top electrode layer.

Again similar to the prior embodiment, the top electrode layer 150 is alloyed with at least another metal alloying element. However, in this embodiment, the concentration of the metal alloy in the top electrode layer 150 may be varied. In various embodiments, the top electrode layer 150 may be doped or alloyed with one or more of ruthenium, titanium, indium, aluminum, nickel, magnesium, and germanium.

As illustrated in the 1-D profile of FIG. 2B, in one or more embodiments, the concentration of the alloying element may be highest at the interface between the top electrode layer 150 and the switching layer 130. This peak concentration may vary from about 10% to about 90% by fractional atomic concentration in various embodiments. In one embodiment, the concentration of the alloying element may vary as illustrated by the first curve C1, which has a step profile extending for about half the thickness of the top electrode layer 150. In another embodiment, the concentration of the alloying element may vary as illustrated by the second curve C2, which also has a step profile but extends to a smaller thickness than the first curve. In contrast, in other embodiments, the concentration of the alloying element may vary continuously, for example, as illustrated by the third curve C3 and the fourth curve C4. Similarly, in some embodiments, the concentration of the alloying element may vary linearly as in the fifth curve C5.

In alternative embodiments, as illustrated in 1-D profile of FIG. 2C, the concentration of the alloying element may have a maximum at the top interface of the top electrode layer 150. For example, as illustrated by the sixth curve C6, the concentration of the alloying element may linearly decrease from the top surface of the top electrode layer 150. In alternative embodiments, as illustrated by seventh curve C7, eighth curve C8, and ninth curve C9, there may be two maximums in the alloying element. For example, this may occur due to the tendency of the alloying element to segregate at the interface between the top electrode layer 150 and the switching layer 130 and when the alloying element is introduced from the top surface described in FIGS. 7C-7E.

In various embodiments, more than one alloying metal may be introduced into the top electrode layer 150. In various embodiments, the different types of alloying metals may be doped in various configurations as described in FIGS. 1, 2A-2C. For example, in one embodiment, a first alloying metal may be doped to have the first curve C1 while a second alloying metal may be doped to have the sixth curve C6. This may be advantageous to tailor the various properties of the top electrode layer 150 such as grain size, grain boundaries, grain orientation, morphology, and agglomeration characteristics.

As illustrated in various embodiments in FIGS. 2B-2D, the concentration of the alloying elements may change within the graded profile by at least 100 times to 1000 times within 10% to about 50% of the thickness of the top electrode layer 150, e.g., about 1 nm to about 10 nm from an interface of the top electrode layer 150 with the switching layer 130.

Figure 3A:
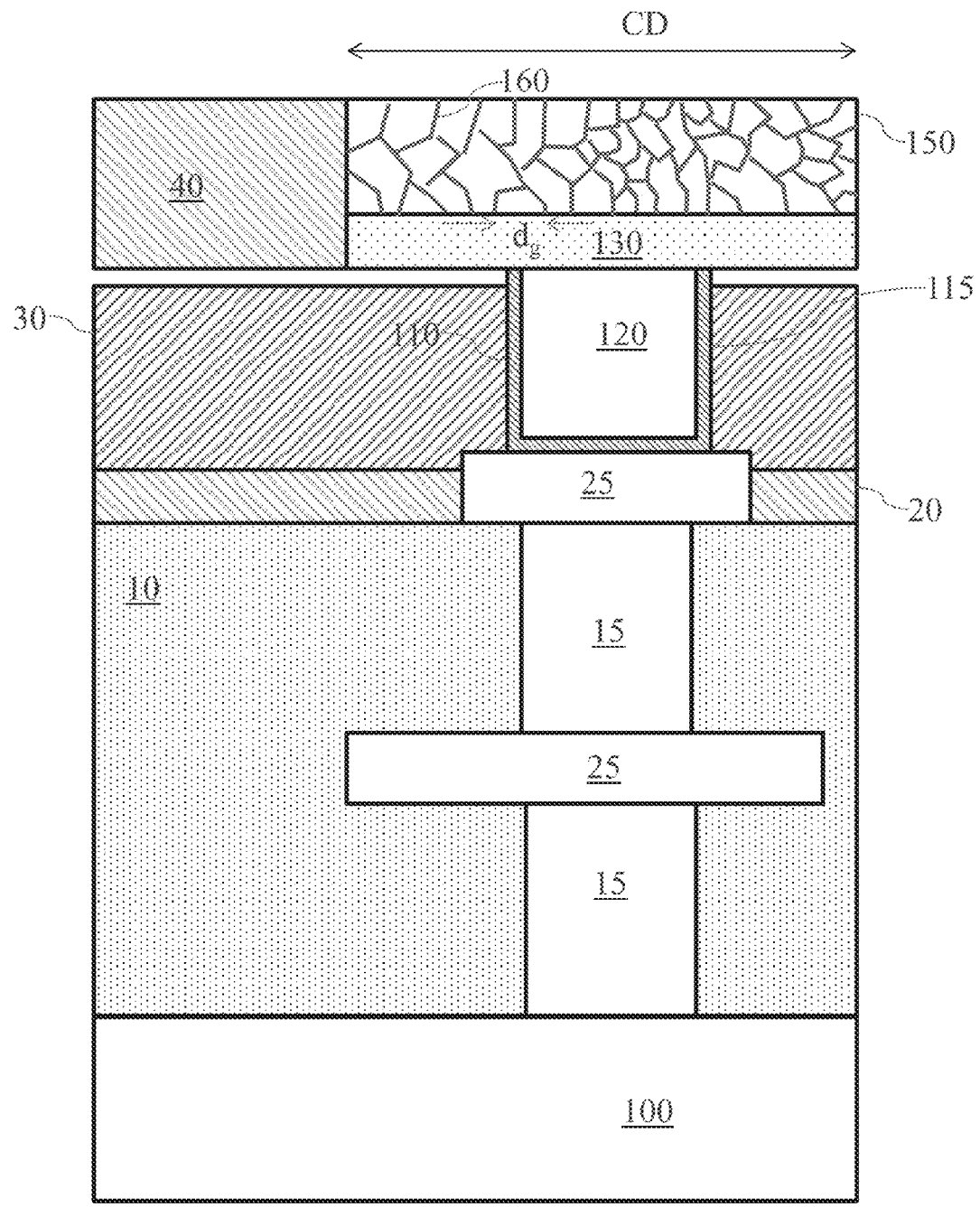
FIGS. 3A-3B, illustrates resistive switching devices having varying grain morphologies in accordance with alternative embodiments of the invention.
Figure 3B:
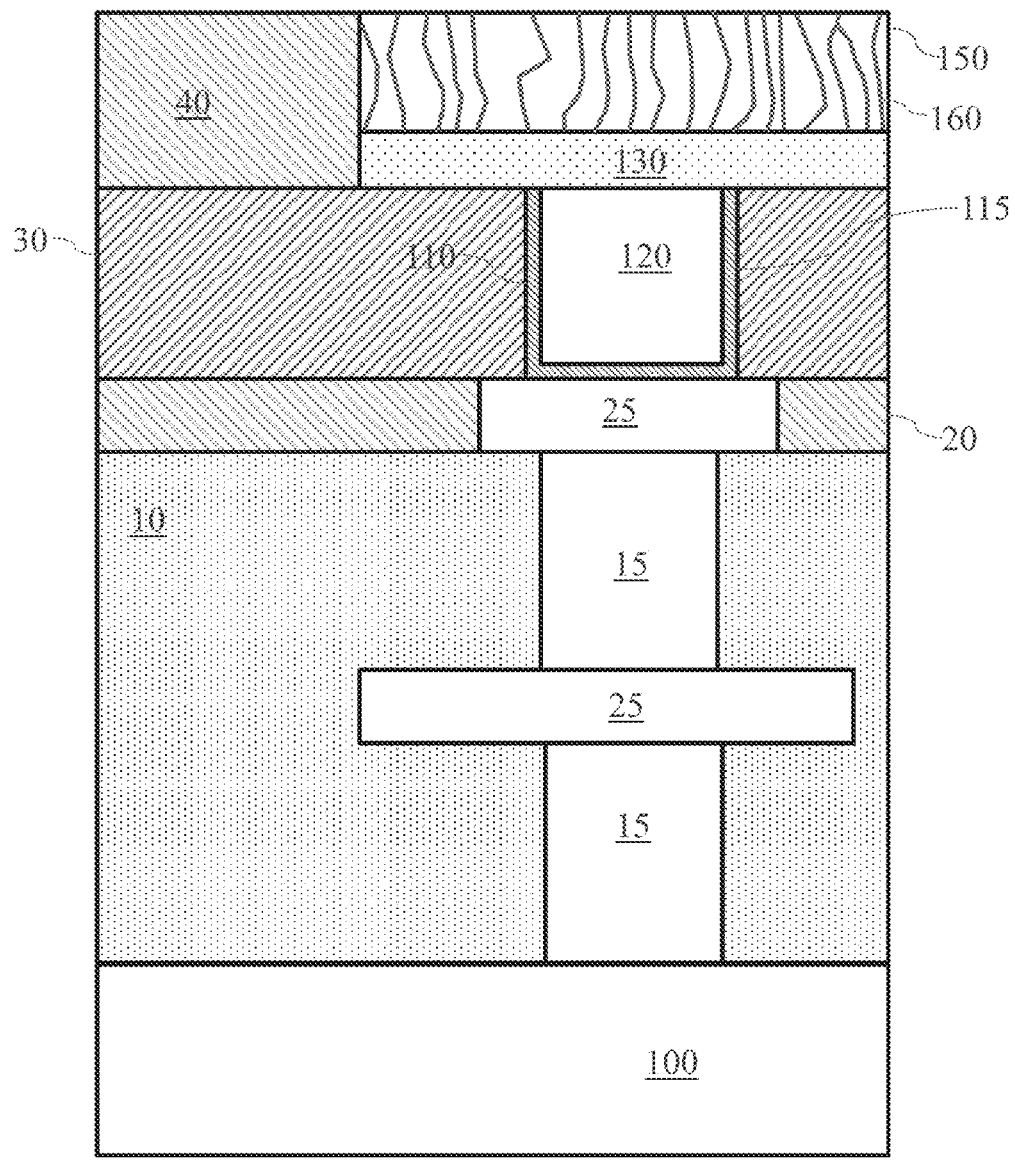

FIG. 3, which includes FIGS. 3A-3B, illustrates resistive switching devices in accordance with alternative embodiments of the invention.

Using various embodiments of the invention, in case the top electrode layer 150 comprises a crystalline material, grain size, grain boundaries, grain orientation, morphology and agglomeration characteristics may be engineered by varying the type and concentration profile of the alloying elements in the top electrode layer 150 with various amounts of one or more of the alloying metal. Due to the inclusion of the alloying metal elements, agglomeration of the memory metal may be suppressed. For example, the alloy metal may modulate the grain size with varying content of the alloy metal. The resulting change in grain size may further change the agglomeration behavior of the memory metal. In various embodiments, grain size and morphology may also be combined with the deposition methodology such as temperature, pressure, temperature of deposition which may also improve morphology and thermal stability.

Accordingly, as illustrated in FIG. 3A, in or more embodiments, the alloying metal may be used to reduce the grain size of the top electrode layer 150. For example, in one embodiment, an alloying metal is chosen that reduces or prevents grain growth and/or coarsening. For example, in one embodiment, the alloying metal may pin the grain boundaries reducing normal grain growth.

As illustrated in FIG. 3A, the top electrode layer 150 may comprise a large number of grain boundaries intersecting with the interface of the switching layer 130. The smaller grain size may advantageously increase the operating speed because grain boundary diffusion is much faster (e.g., at least 1000 times) than diffusion through the grain. Consequently, the large fraction of grain boundaries within the top electrode layer 150 may increase the performance of the resistive switching device due to the faster migration of the memory metal ions. Further, the smaller grain size may also advantageously reduce random fluctuations. In various embodiments, the grain size $d_g$ along the interface between the top electrode layer 150 and the switching layer 130 is at least ten times smaller than the critical dimension CD. In one or more embodiments, the grain size $d_g$ along the interface between the top electrode layer 150 and the switching layer 130 is at least hundred times smaller than the critical dimension CD. In one or more embodiments, the grain size $d_g$ along the interface between the top electrode layer 150 and the switching layer 130 is about 100 to about 1000 times smaller than the critical dimension CD. In one or more embodiments, the grain size $d_g$ along the interface between the top electrode layer 150 and the switching layer 130 is about 0.5 nm to about 5 nm, and about 1 nm to about 10 nm in another embodiment.

FIG. 3B illustrates an alternative embodiment having columnar grains within the top electrode layer 150. In alternative embodiments, the metal alloy may be used to generate columnar grains. Columnar grains may be advantageous to control or avoid the agglomeration of the memory metal and minimize variation in the work function along the interface between the top electrode layer 150 and the switching layer 130.

Figure 4:
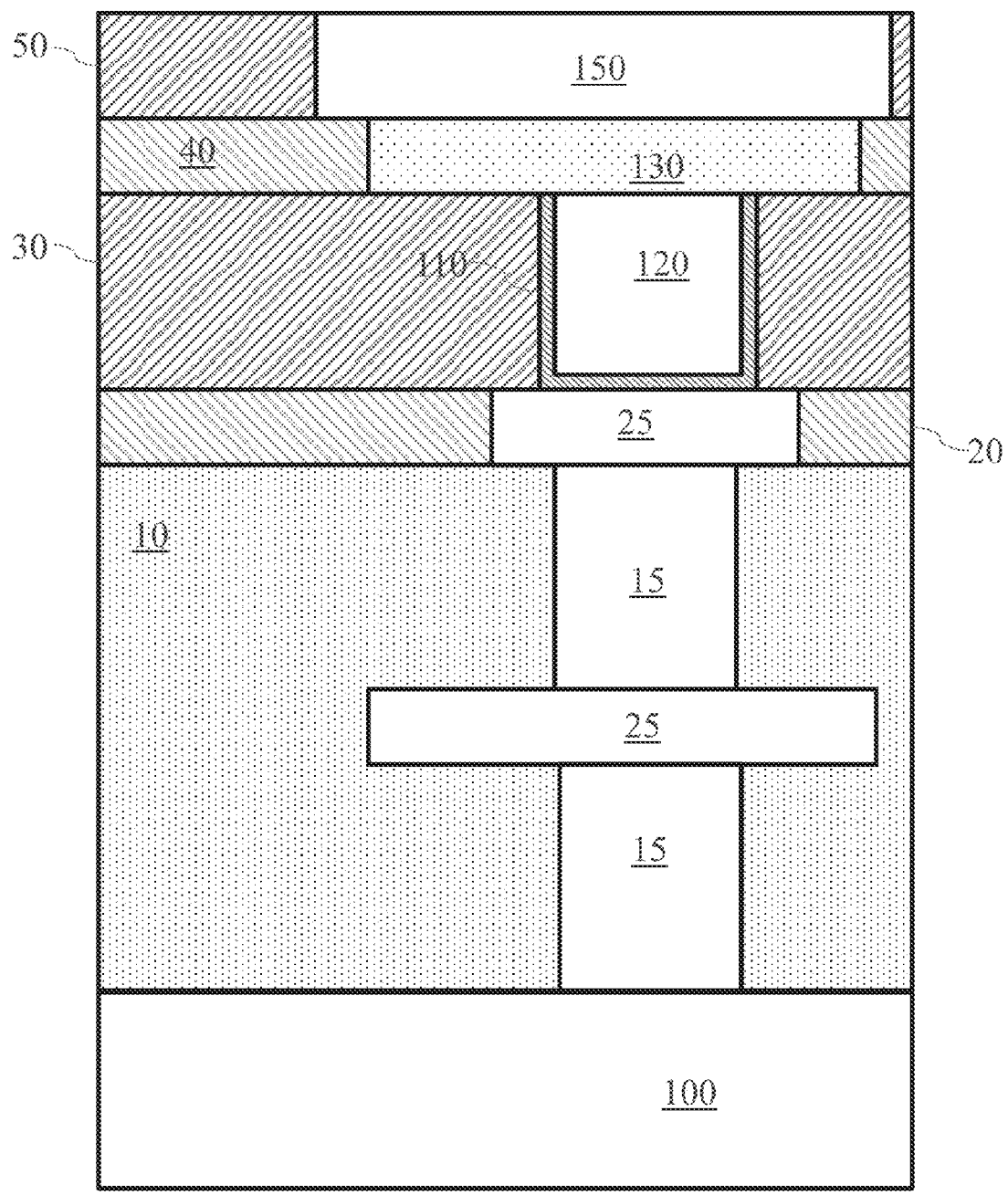
FIG. 4 illustrates a cross-sectional view of a resistive switching device having a different structural configuration in accordance with an alternative embodiment of the invention.

FIG. 4 illustrates a cross-sectional view of a resistive switching device having a different structural configuration in accordance with an embodiment of the invention.

The resistive devices described above in FIGS. 1-3 may be formed with different structural ratios. As an example, FIG. 4 shows one possible structure in which the foot print (or at least one critical dimension) of the switching layer 130 is less than the foot print of the top electrode layer 150. Accordingly, the switching layer 130 may be disposed in a fourth insulating layer 40, while the top electrode layer 150 may be disposed in a separate fifth insulating layer 50.

FIG. 5, which includes FIGS. 5A-5D, illustrates cross-sectional views of a resistive switching device during various stages of fabrication in accordance with embodiments of the invention.

Figure 5A:
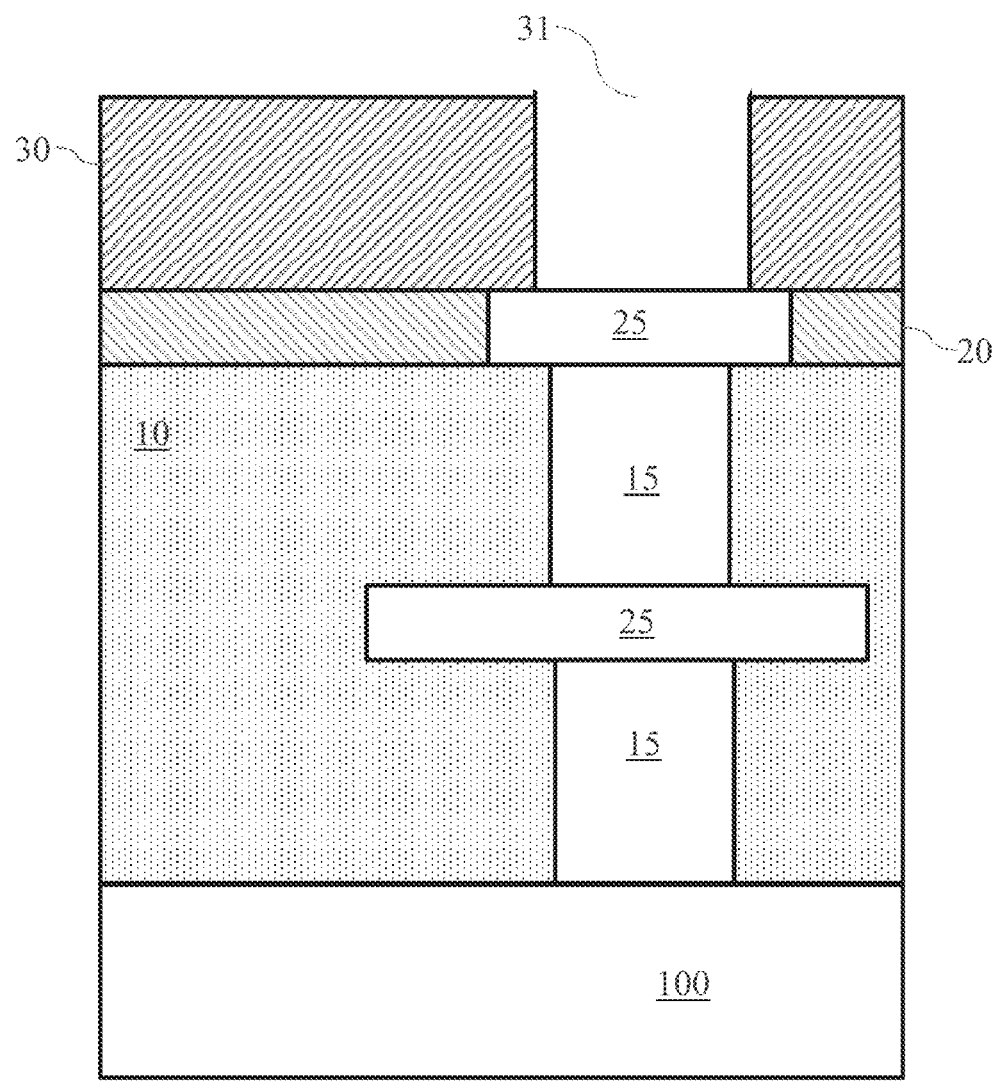
FIGS. 5A-5D, illustrates cross-sectional views of a resistive switching device during various stages of fabrication in accordance with embodiments of the invention.

Referring to FIG. 5A, the substrate 100 is processed using conventional processing. For example, active regions may be formed within the substrate 100. The active regions may comprise device regions such as transistors, diodes, and other devices. After forming the active regions, metallization layers are formed above the substrate 100. For example, a plurality of vias 15 and a plurality of metal lines 25 may be formed as illustrated in FIG. 5A.

In various embodiments, a bottom electrode may be formed within the third dielectric layer 30, which may comprise silicon nitride, silicon oxide, and others and may be about 10 nm to about 1000 nm, and about 30 nm to about 50 nm in one case. In one or more embodiments, the third dielectric layer 30 may be deposited using a chemical vapor deposition process or a plasma enhanced chemical vapor deposition process. The third dielectric layer 30 may also be deposited using a physical vapor deposition (PVD), although in different embodiments, other deposition techniques may be used. As illustrated in FIG. 5A, an opening 31 is formed within the third insulating layer, which is formed over the substrate 100.

Figure 5B:
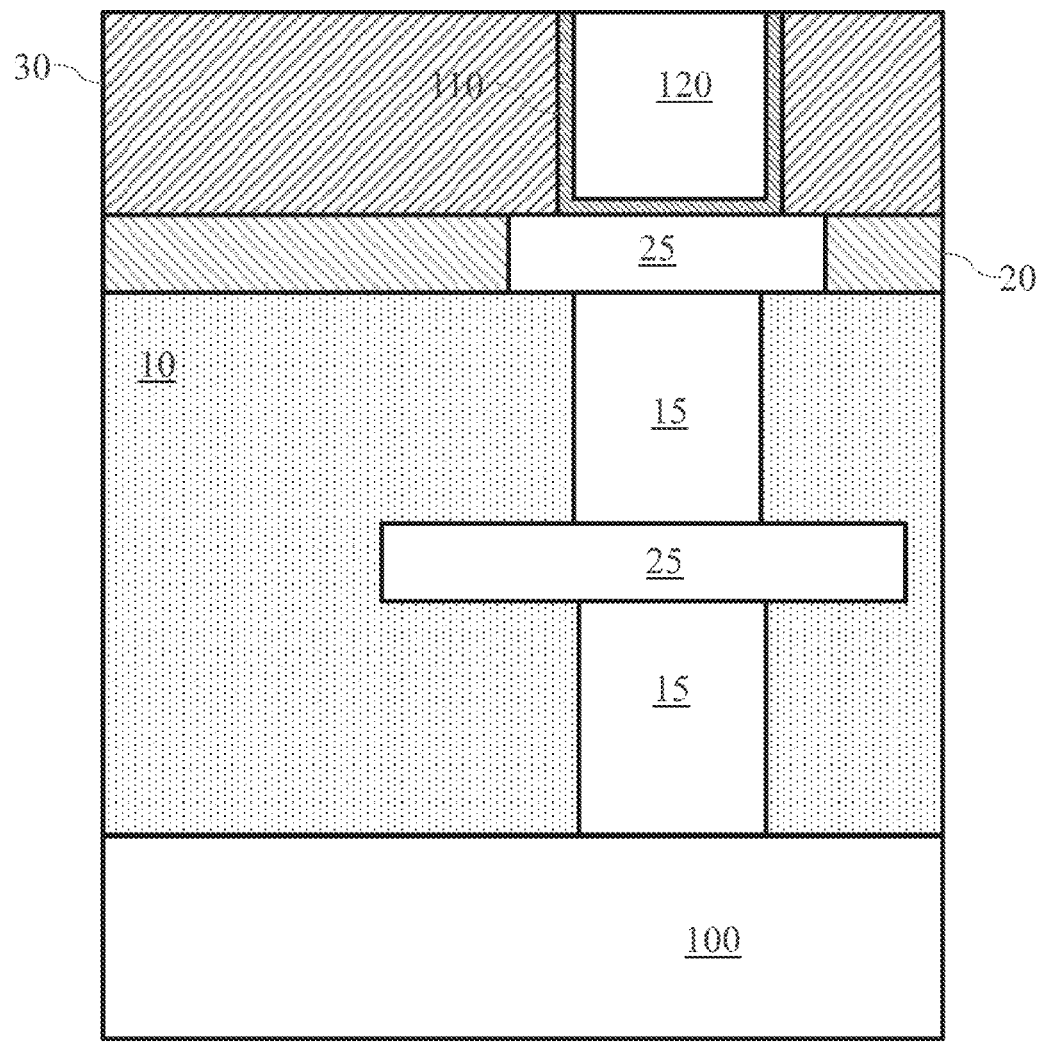

Referring to FIG. 5B, a barrier layer 110 is deposited within the opening 31. In various embodiments, the barrier layer 110 may be deposited using sputtering, a vapor deposition process such as physical vapor deposition, chemical vapor deposition, and other suitable processes. The barrier layer 110 may comprise an inert material that is also a diffusion blocking material such as titanium nitride, tantalum nitride and others.

Next, a fill material 120 is deposited within the opening 31. The fill material 120 may be deposited using multiple processes in various embodiments. For example, a thin layer of the fill material 120 may be deposited first using a physical vapor deposition (PVD) process to ensure good adhesion with the barrier layer 110. Next, a chemical vapor deposition process may be used to fill the opening 31 with the fill material 120. The fill material 120 may comprise an inert material such as tungsten in one embodiment. The fill material 120 may be planarized as needed and any remaining barrier layer 110 over the top surface of the third insulating layer 30 is removed, for example, using a wet etching.

Figure 5C:
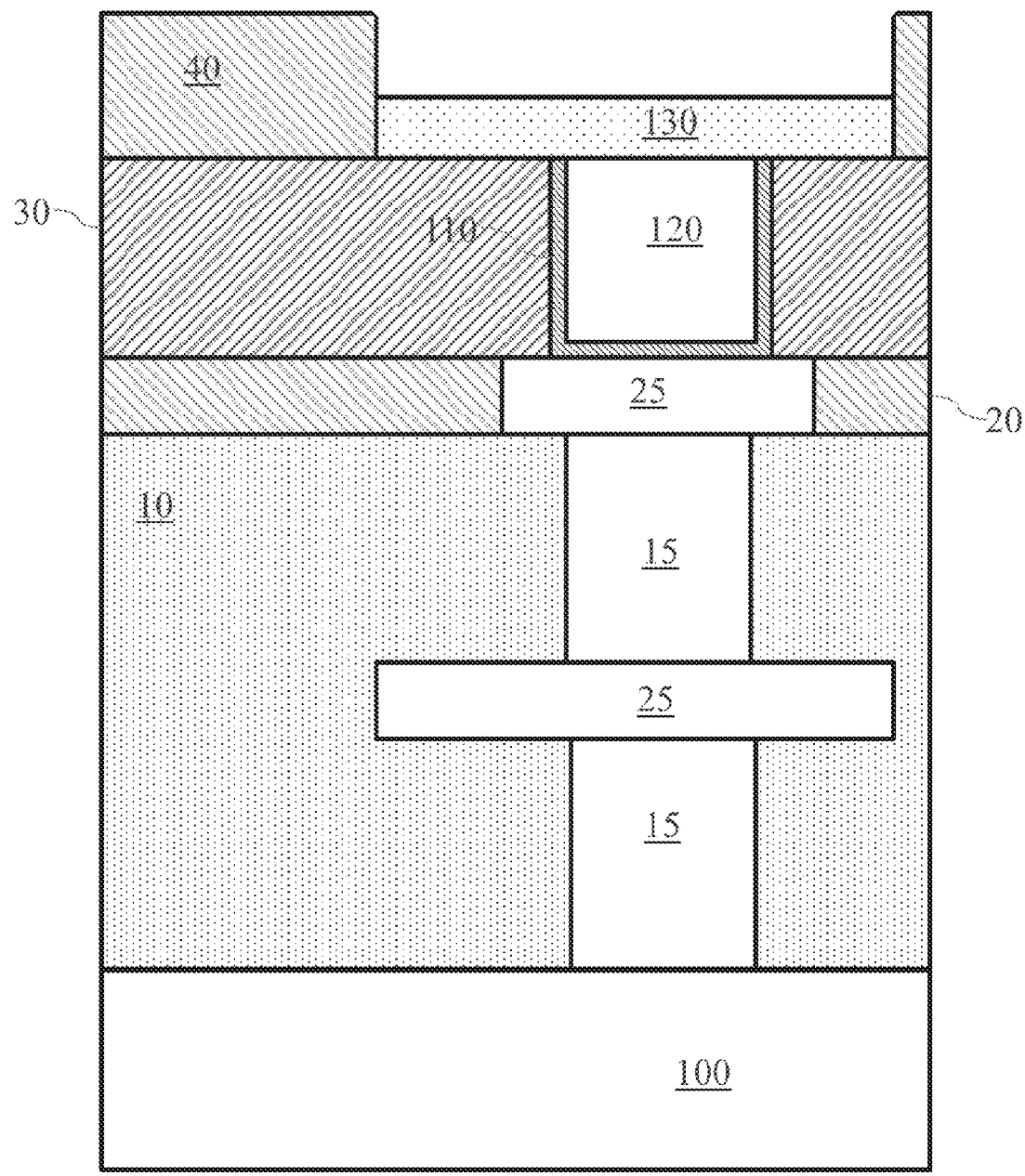

Referring to FIG. 5C, a fourth insulating layer 40 is deposited over the third insulating layer 30. The fourth insulating layer 40 is patterned to form an opening for the switching layer 130, which may be deposited within the opening. In various embodiments, the switching layer 130 may comprise a thin film of $GeS_2$ deposited by radio frequency (RF) PVD process and a thin layer of copper or silver deposited by DC PVD process. This silver layer is subsequently dissolved into the $GeS_2$ film using a photo-diffusion process form a copper or silver doped $GeS_2$ layer.

In other embodiments, the switching layer 130 may be formed, e.g., using a deposition process to form $WO_3$, $Cu/Cu_2S$, $Cu/Ta_2O_5$, $Cu/SiO_2$, $Ag/Zn_xCd_{1-x}S$, $Cu/Zn_xCd_{1-x}S$, $Zn/Zn_xCd_{1-x}S$, GeTe, GST, As—S, $Zn_xCd_{1-x}S$, $TiO_2$, $ZrO_2$, $SiO_2$. In some embodiments, a plurality of layers may be deposited, for example, using an atomic layer deposition process to form a stack comprising $Ge_xSe_y/SiO_x$, $Ge_xSe_y/Ta_2O_5$, $Cu_xS/Cu_xO$, $Cu_xS/SiO_2$. In further embodiments, one or more layers of $NiO_x$, $TiO_x$, $Al_2O_3$, $Ta_2O_5$, $CuO_x$, $WO_x$, CoO, $Gd_2O_3$, $HfO_2$, chromium doped perovskite oxides such as $SrZrO_3$, $(Ba, Sr)TiO_3$, $SrTiO_3$, copper doped $MoO_x$, copper doped $Al_2O_3$, copper doped $ZrO_2$, Al doped ZnO, $Pr_{0.7}Ca_{0.3}MnO_3$ may be deposited.

Figure 5D:
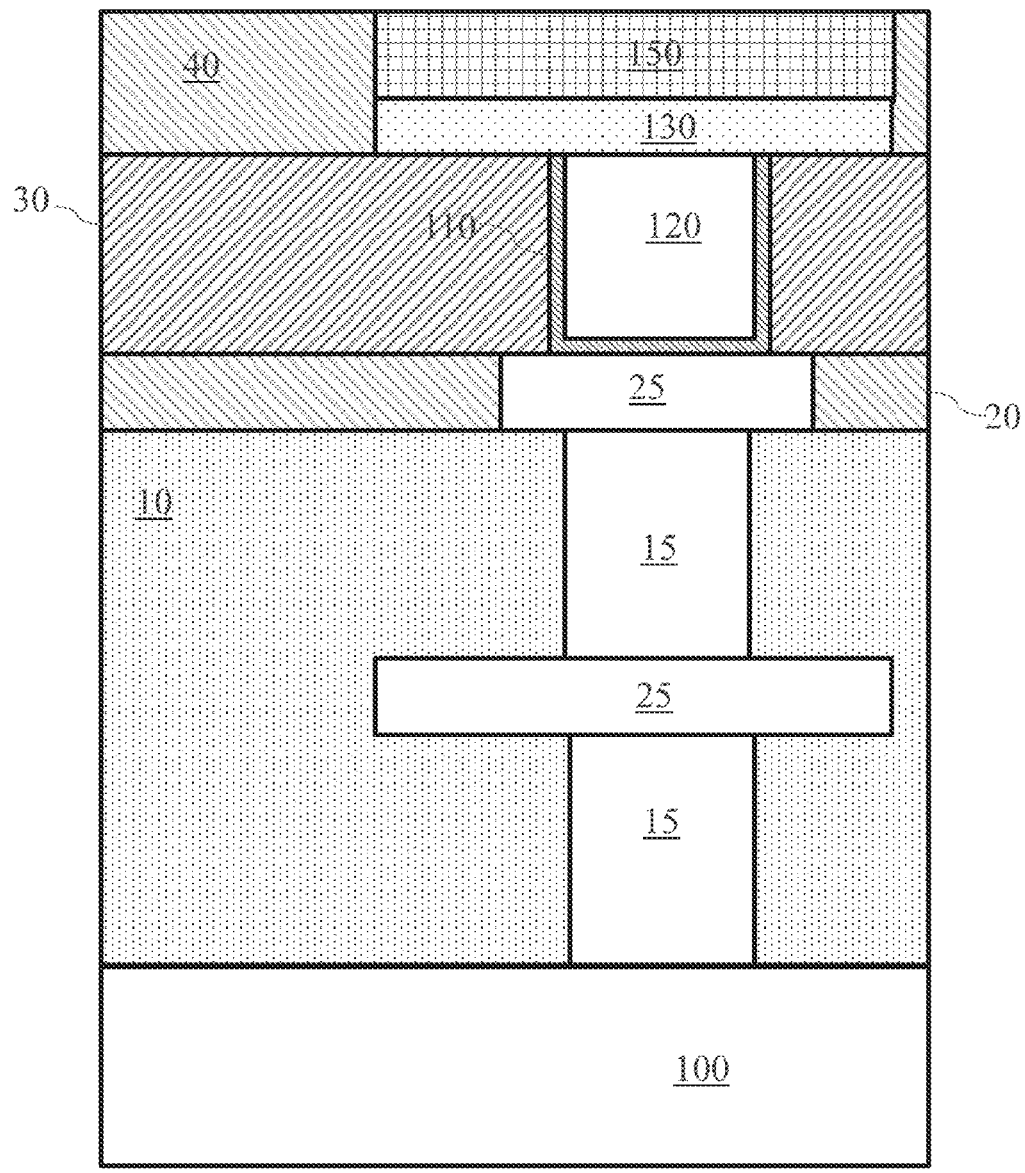

Referring next to FIG. 5D, a top electrode layer 150 comprising a memory metal and at least one metal alloy element is formed over the switching layer 130. In one or more embodiments, the top electrode layer 150 may be formed as an alloy having a graded profile, for example, as described with respect to FIG. 2. However, in some embodiments, the top electrode layer 150 may be formed without any grading, for example, as described with respect to FIG. 1.

In various embodiments, the top electrode layer 150 is formed by the deposition of an electrochemically active metal (memory metal) such as copper, silver, zinc and others. In various embodiments, the top electrode layer 150 includes at least one metal alloying element from the group consisting of ruthenium, titanium, indium, aluminum, nickel, magnesium, and germanium. During the deposition of the top electrode layer 150, the process conditions in the deposition chamber may be varied so as to vary the amount of the alloy metal being incorporated within the depositing top electrode layer 150. For example, the amount of alloy metal may be varied based on a predetermined process in one embodiment. Alternatively, in another embodiment, the process conditions in the deposition chamber may be changed dynamically based on in-line monitoring of the deposition chamber and/or the depositing material.

Further embodiments of the forming the top electrode layer 150 will be described using FIGS. 6 and 7.

Figure 6A:
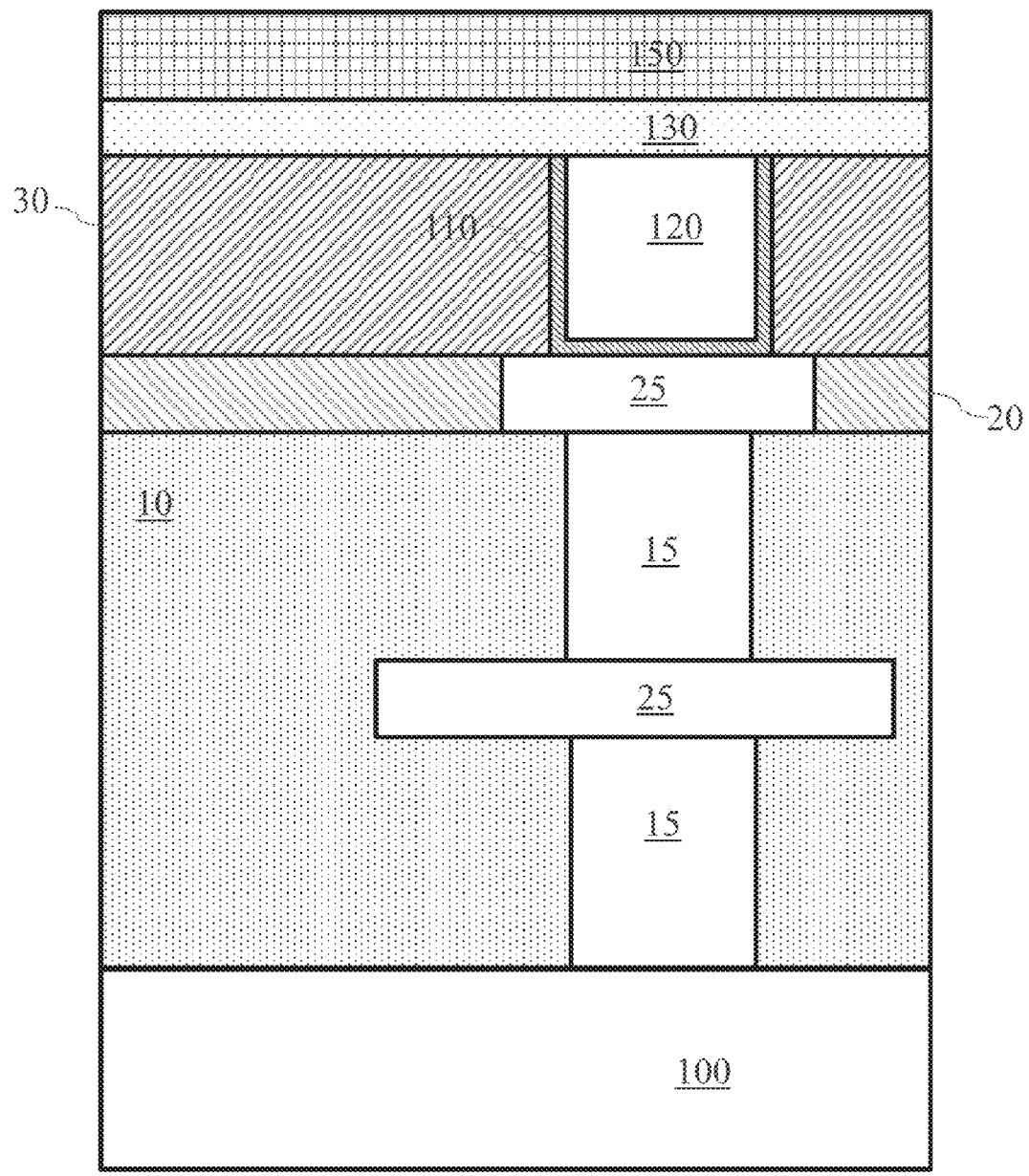
FIGS. 6A and 6B, illustrates cross-sectional views of a resistive switching device during various stages of fabrication in accordance with alternative embodiments of the invention.
Figure 6B:
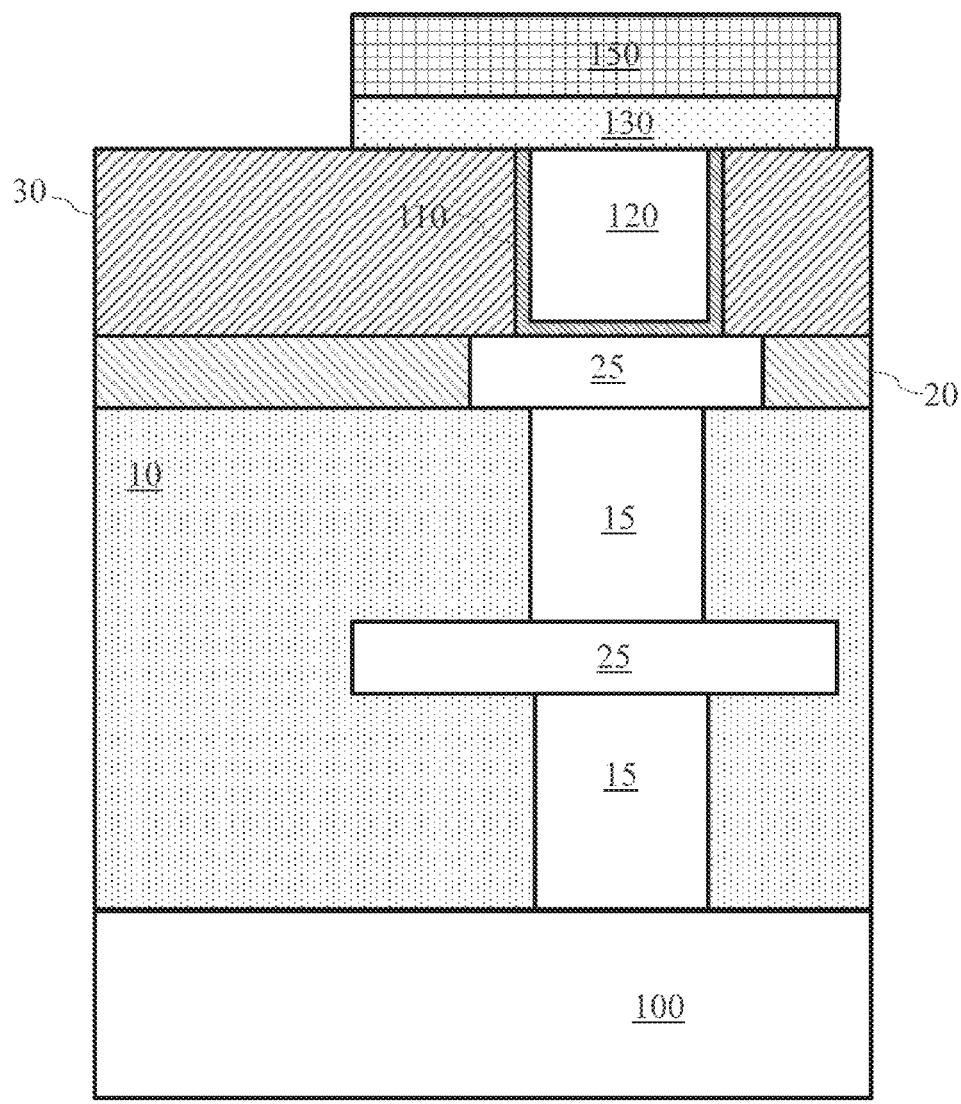

FIG. 6, which includes FIGS. 6A and 6B, illustrates cross-sectional views of a resistive switching device during various stages of fabrication in accordance with alternative embodiments of the invention.

This embodiment may proceed as described in prior embodiments with respect to FIGS. 5A-5B. Instead of forming patterned layers separately as in the prior embodiment, in this embodiment, the switching layer 130 and the top electrode layer 150 may be deposited sequentially and patterned using a subtractive etch process.

As illustrated in FIG. 6A, the switching layer 130 and the top electrode layer 150 may be formed as blanket layers (unpatterned). Referring to FIG. 6B, the switching layer 130 and the top electrode layer 150 are patterned. In one embodiment, the switching layer 130 and the top electrode layer 150 may be patterned using a single etch process. Alternatively, in other embodiments, the etch process and/or chemistry may be changed for one or more layers.

The fourth insulating layer 40 may be deposited over the patterned switching layer 130 and the patterned top electrode layer 150 to form a structure as illustrated in FIG. 5D.

FIG. 7, which includes FIGS. 7A-7E, illustrates cross-sectional views of a resistive switching device during fabrication in accordance with alternative embodiments of the invention.

Figure 7A:
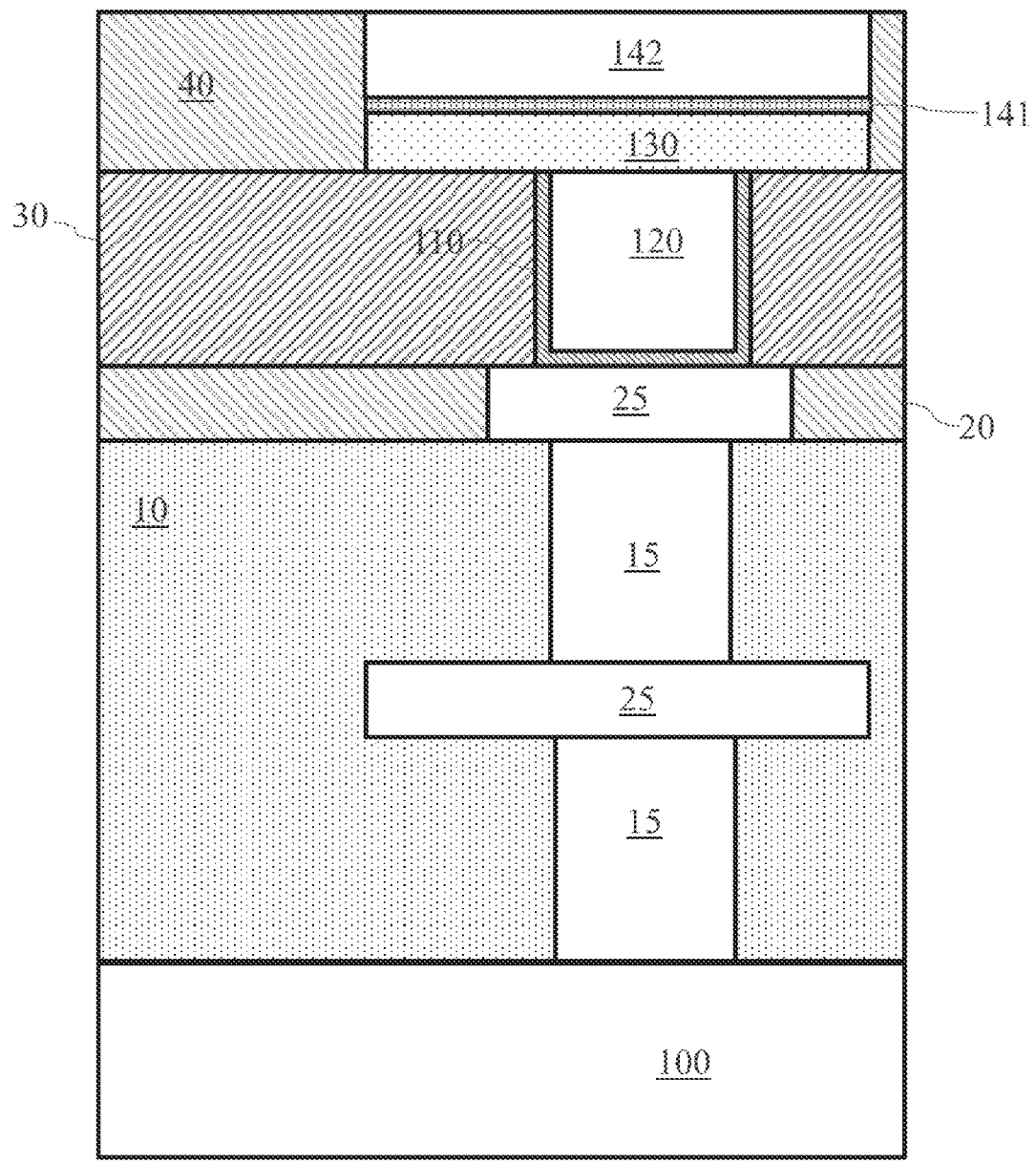
FIGS. 7A-7E, illustrates cross-sectional views of a resistive switching device during fabrication in accordance with alternative embodiments of the invention.

Referring to FIG. 7A, a first layer 141 comprising the metal alloy is deposited over the switching layer 130. The first layer 141 may comprise a thickness of about 1 nm to about 50 nm in various embodiments. Next, a second layer 142 comprising the memory metal is deposited over the first layer 141. A thermal process such as an annealing process may be performed subsequently. The thermal process may be a common process step during the fabrication of another layer over the substrate 100 in some embodiments. The thermal process may cause a reorientation or mixing of the first layer 141 and the second layer 142 to form the top electrode layer 150, e.g., as illustrated in FIGS. 5D or 6B (as well as FIGS. 1-4). The mixing process may partially mix the first layer 141 with the second layer 142 without completely dissolving the first layer 141 in some embodiments. In alternative embodiments, some of the mixing between the first layer 141 and the second layer 142 may be performed prior to consumer use such as during burn-in operations.

Figure 7B:
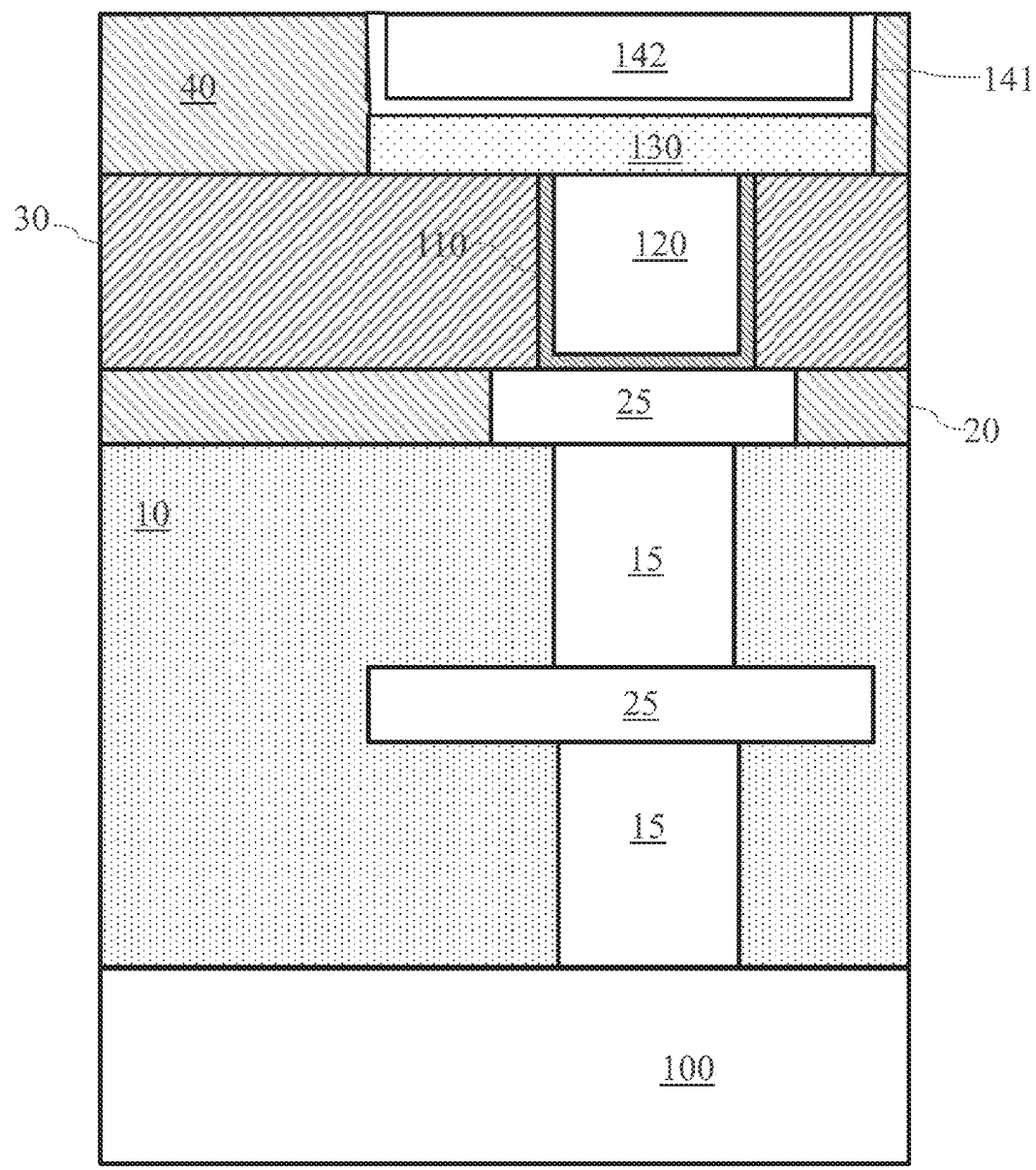

FIG. 7B illustrates an alternative embodiment in which the first layer 141 is formed as a liner along the fourth insulating layer 40. The second layer 142 is deposited over the first layer 141 to form the top electrode layer 150. A thermal treatment may be followed as described above in various embodiments.

Figure 7C:
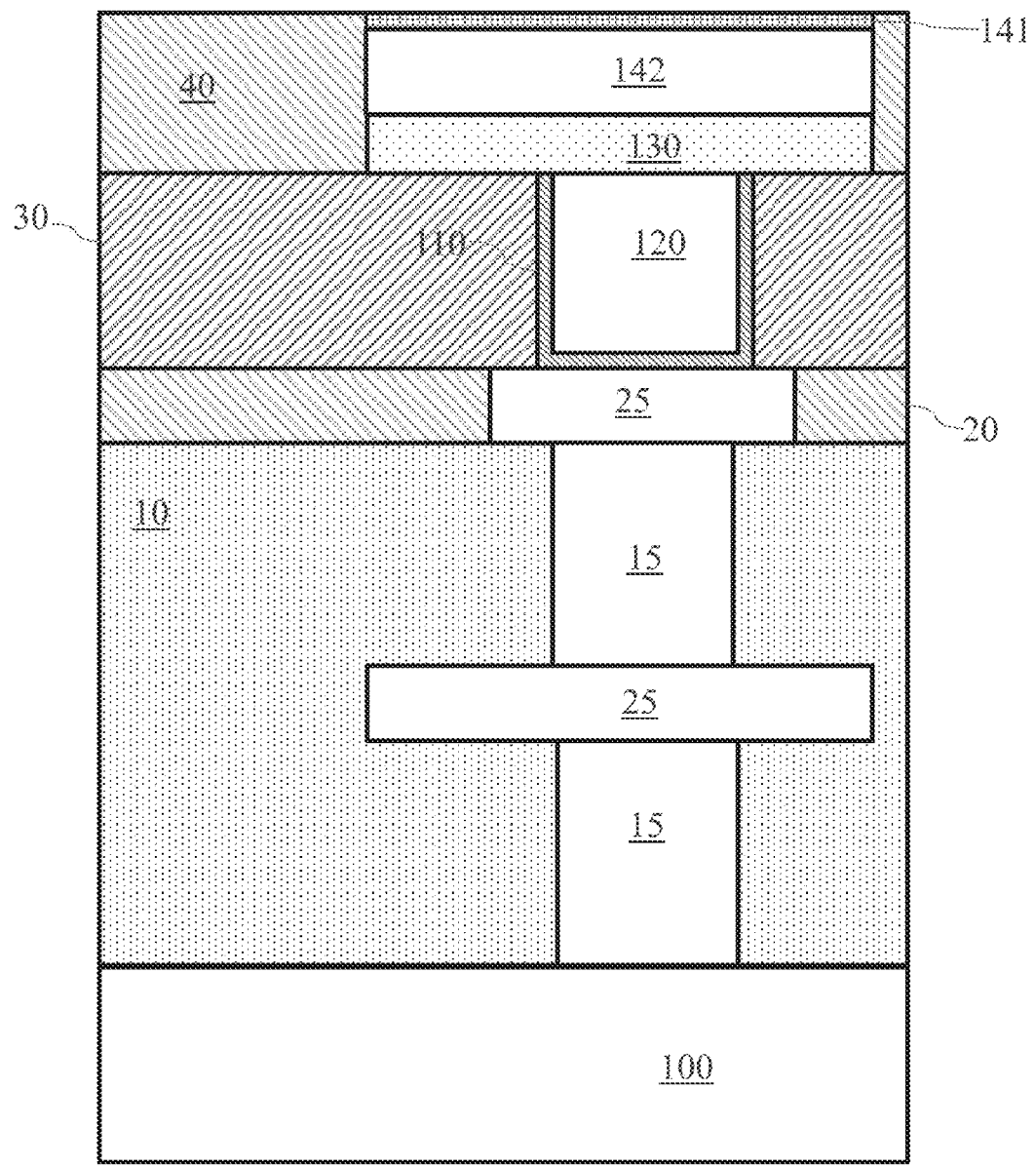

FIG. 7C illustrates a further embodiment of forming the top electrode layer 150. In the embodiments described in FIGS. 7A and 7B, the concentration of the metal alloy has a likely maximum proximate the switching layer 130 as described in FIG. 2B. In contrast, in this embodiment, the first layer 141 comprising the metal alloy is deposited over the second layer 142 comprising the memory metal. This embodiment may form a metal alloy having a maximum concentration, including two maxima's, at the top surface, for example, as illustrated in FIG. 2C. As described above with respect to FIG. 7A, a thermal process may be used after forming the first layer 141 to finalize the top electrode layer 150. Further, in some embodiments, the first layer 141 may be removed after performing the thermal treatment, i.e., after forming the top electrode layer 150, any remaining unreacted first layer 141 may be removed. This may be used to control the amount of the metal alloy in the top electrode layer 150.

Figure 7D:
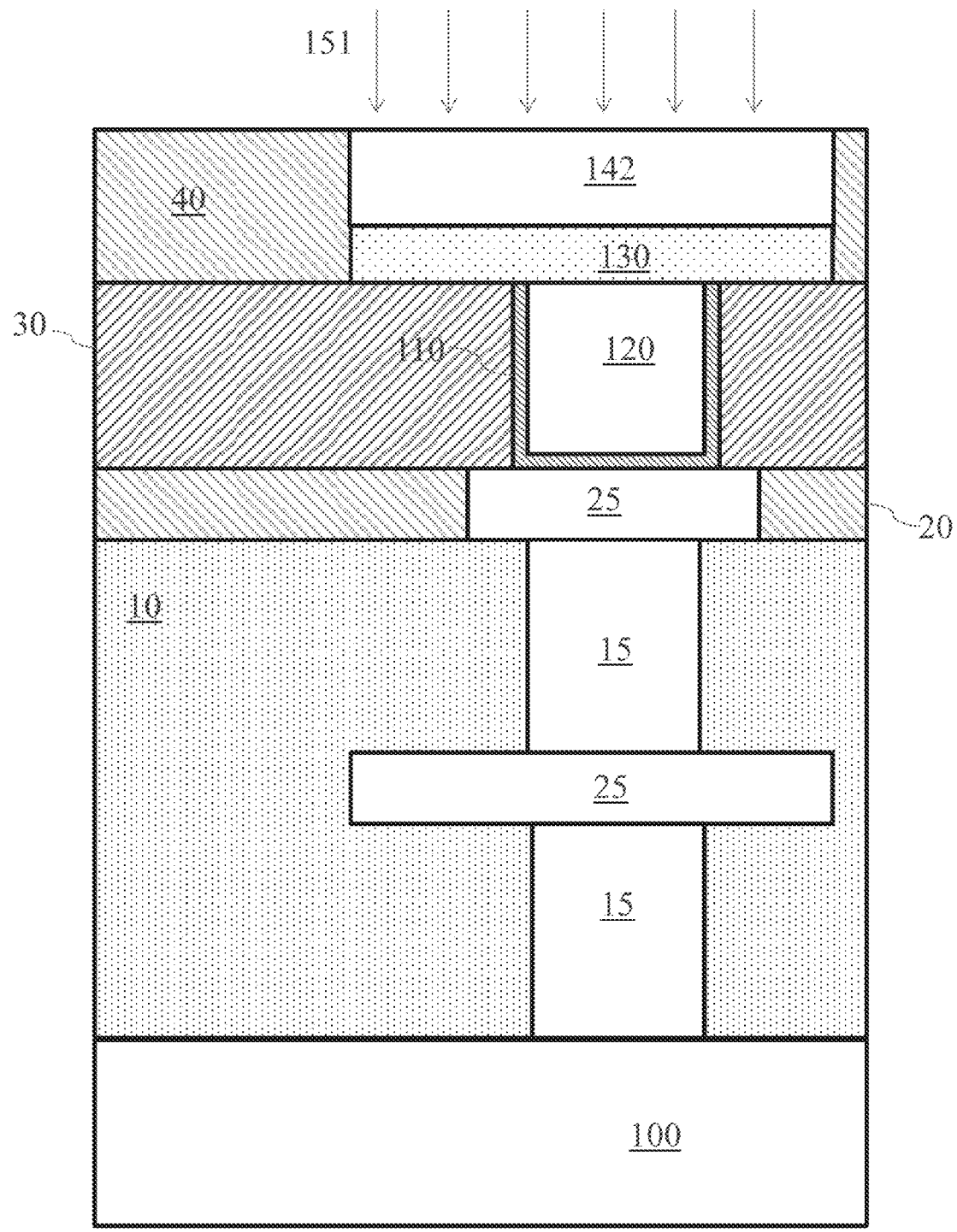
Figure 7E:
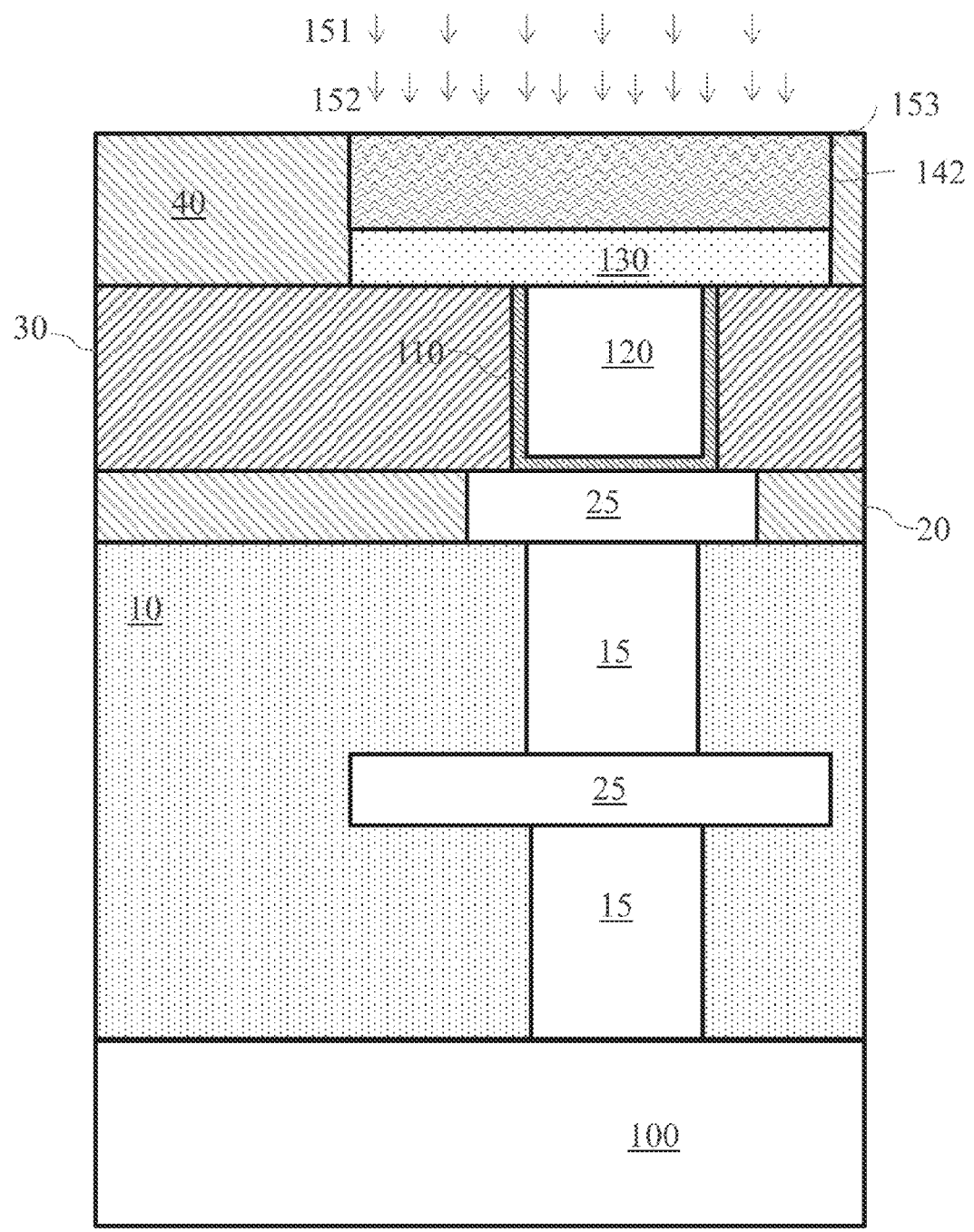

FIG. 7D illustrates a further embodiment of forming the top electrode layer 150 in which the metal alloy 151 is introduced using ion implantation. In this embodiment, the second layer 142 is directly deposited over the switching layer 130. Next, using an implantation process a metal alloy 151 may be introduced into the second layer 142. In various embodiments, the implant dose of the metal alloy 151 into the second layer 142 may be about 0.1 to about 0.5 of the total dose of atoms in the switching layer. In various embodiments, other types of introducing the metal alloy 151 may also be used, for example, using a plasma process.

After implanting the metal alloy 151 into the second layer 142 comprising the memory metal, a thermal process may be used to form the top electrode layer 150 as described in prior embodiments. In a further embodiment illustrated in FIG. 7E, the metal alloy 151 or an additional inert impurity 152 may be used to amorphize the second layer 142 thereby forming an amorphous layer 153. For example, the grains in the second layer 142 may assume a certain morphology during the deposition of the second layer 142. An amorphization process may then be used to amorphize the second layer 142. The amorphous layer 153 is next recrystallized. The recrystallization process may form a different morphology than the deposited morphology because the recrystallization may be performed either using a different thermal process and/or in the presence of the metal alloy 151, which may modify both the recrystallization behavior as well as the subsequent grain growth. In various embodiments, the dose and energy of the metal alloy 151 and/or the additional impurity may be modified to amorphize the second layer 142. The amorphization may be selected to completely amorphize the second layer 142 in one embodiment.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-7 may be combined with each other in further embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A resistive switching device comprising:
a bottom electrode;
a switching layer comprising a memory metal disposed over the bottom electrode; and
a top electrode disposed over the switching layer, the top electrode comprising an alloy of the memory metal and an alloying element, the top electrode providing a source of the memory metal in the switching layer, the memory metal being configured to change a state of the switching layer, wherein the concentration of the alloying element has a graded profile within the top electrode.

2. The device of claim 1, wherein the alloying element comprises copper and the memory metal comprises silver.

3. The device of claim 1, wherein the alloying element comprises an element selected from the group consisting of indium, aluminum, nickel, and magnesium.

4. The device of claim 1, wherein the atomic ratio of the alloying element to the memory metal in the top electrode is about 5% atomic fraction to about 50% atomic fraction.

5. The device of claim 1, wherein the total number of atoms of the alloying element in the top electrode is about 10% to about 50% of the total number of atoms in the switching layer.

6. The device of claim 1, wherein the alloying element has a peak concentration proximate an interface between the switching layer and the top electrode.

7. The device of claim 1, wherein the alloying element has a peak concentration at a top surface of the top electrode, the top surface being opposite to a bottom surface at an interface between the switching layer and the top electrode.

8. The device of claim 1, wherein an interface between the switching layer and the top electrode has a surface roughness less than about 5 nm.

9. The device of claim 1, wherein the top electrode has a length along an interface between the switching layer and the top electrode, wherein the top electrode comprises a plurality of grains, and wherein the length of the top electrode is at least 10 times an average diameter of the plurality of grains along the interface.

10. The device of claim 1, wherein the top electrode comprises an amorphous material.

11. The device of claim 1, wherein the resistive switching device comprises a conductive bridging random access memory.

12. The device of claim 1, wherein the resistive switching device comprises a metal oxide memory.

13. A resistive switching device comprising:
an inert electrode;
an electrochemically active electrode spaced apart from the inert electrode, the electrochemically active electrode providing a source of an electrochemically active memory metal, the electrochemically active electrode comprising an alloy of the memory metal and an alloying element; and
a switching layer comprising the memory metal and disposed between the inert electrode and the electrochemically active electrode, wherein the memory metal is configured to change a state of the switching layer, wherein the alloying element has a varying concentration profile within the electrochemically active electrode, wherein the switching layer is a conductive switching layer of a conductive bridging memory, and wherein the electrochemically active memory metal is configured to be electrochemically active in the conductive switching layer of the conductive bridging memory.

14. The device of claim 13, wherein the memory metal comprises silver and wherein the alloying element comprises copper.

15. The device of claim 14, wherein the atomic ratio of the alloying element to the memory metal in the electrochemically active electrode is about 5% atomic fraction to about 50% atomic fraction.

16. The device of claim 14, wherein the alloying element has a maximum concentration proximate an interface between the switching layer and the electrochemically active electrode.

17. The device of claim 14, wherein the alloying element has a maximum concentration at a top surface of the electrochemically active electrode, the top surface being opposite to a bottom surface at an interface between the switching layer and the electrochemically active electrode.

18. The device of claim 14, wherein an interface between the switching layer and the electrochemically active electrode has a surface roughness between about 0.3 nm to about 3 nm.

19. The device of claim 14, wherein the electrochemically active electrode has a length along an interface between the switching layer and the electrochemically active electrode, wherein the electrochemically active electrode comprises a plurality of grains, and wherein the length of the electrochemically active electrode is at least 10 times an average diameter of the plurality of grains along the interface.

20. The device of claim 13, wherein the alloying element comprises an element from the group consisting of ruthenium, titanium, indium, aluminum, nickel, magnesium, and germanium.

21. The device of claim 1, wherein the alloying element comprises an element selected from the group consisting of ruthenium, titanium, and germanium.

22. The device of claim 1, wherein the alloying element has a uniform profile within the top electrode.

23. The device of claim 1, wherein the top electrode comprises columnar grains.

24. The device of claim 1, wherein a foot print of the switching layer is less than a foot print of the top electrode.

25. The device of claim 1, wherein the top electrode comprises a recrystallized material region.

26. A resistive switching device comprising:
an inert electrode;
an electrochemically active electrode spaced apart from the inert electrode, the electrochemically active electrode providing a source of an electrochemically active memory metal, the electrochemically active electrode comprising an alloy of the memory metal and an alloying element, wherein the concentration of the alloying element has a graded profile within the electrochemically active electrode; and
a switching layer comprising the memory metal and disposed between the inert electrode and the electrochemically active electrode, wherein the memory metal is configured to change a state of the switching layer.

27. The device of claim 26, wherein the alloying element comprises copper and the memory metal comprises silver.

28. The device of claim 26, wherein the alloying element comprises an element selected from the group consisting of indium, aluminum, nickel, and magnesium.

29. The device of claim 26, wherein the atomic ratio of the alloying element to the memory metal in the electrochemically active electrode is about 5% atomic fraction to about 50% atomic fraction.

30. The device of claim 26, wherein the total number of atoms of the alloying element in the electrochemically active electrode is about 10% to about 50% of the total number of atoms in the switching layer.

31. The device of claim 26, wherein the alloying element has a peak concentration proximate an interface between the switching layer and the electrochemically active electrode.

32. The device of claim 26, wherein the alloying element has a peak concentration at a top surface of the electrochemically active electrode, the top surface being opposite to a bottom surface at an interface between the switching layer and the electrochemically active electrode.

* * * * *